(12) United States Patent
Kanki et al.

(10) Patent No.: US 10,474,602 B2
(45) Date of Patent: Nov. 12, 2019

(54) SYSTEM AND METHOD FOR DISTRIBUTED CONSOLE SERVER ARCHITECTURE

(71) Applicant: AVOCENT HUNTSVILLE, LLC, Huntsville, AL (US)

(72) Inventors: Dante Kanki, Fremont, CA (US); Marcelo E. Peccin, Milpitas, CA (US)

(73) Assignee: Vertiv IT Systems, Inc., Huntsville, AL (US)

( * ) Notice: Subject to any disclaimer, the term of this patent is extended or adjusted under 35 U.S.C. 154(b) by 0 days.

(21) Appl. No.: 15/665,875

(22) Filed: Aug. 1, 2017

(65) Prior Publication Data

US 2018/0039592 A1 Feb. 8, 2018

Related U.S. Application Data

(60) Provisional application No. 62/370,006, filed on Aug. 2, 2016.

(51) Int. Cl.
*G06F 13/362* (2006.01)
*G06F 13/22* (2006.01)
*H04L 29/06* (2006.01)
*H05K 7/14* (2006.01)
*H04L 12/24* (2006.01)

(52) U.S. Cl.
CPC .......... *G06F 13/362* (2013.01); *G06F 13/225* (2013.01); *H04L 41/20* (2013.01); *H04L 41/24* (2013.01); *H04L 67/42* (2013.01); *H05K 7/1485* (2013.01)

(58) Field of Classification Search
CPC .................................................. G09G 2370/24

USPC ..... 709/203, 223, 217, 219, 250; 710/1, 315
See application file for complete search history.

(56) References Cited

U.S. PATENT DOCUMENTS

| 5,428,806 | A | * | 6/1995 | Pocrass | G06F 13/409 |
| | | | | | 710/100 |
| 6,098,131 | A | * | 8/2000 | Unger | H05K 7/1435 |
| | | | | | 361/679.4 |
| 6,175,490 | B1 | * | 1/2001 | Papa | G06F 13/409 |
| | | | | | 312/223.2 |
| 6,249,913 | B1 | * | 6/2001 | Galipeau | H04N 7/17318 |
| | | | | | 348/E5.002 |
| 6,466,434 | B1 | * | 10/2002 | Tsai | G06F 1/184 |
| | | | | | 360/99.18 |

(Continued)

OTHER PUBLICATIONS

Notification of Transmittal of the International Search Report and Written Opinion of the International Search Authority dated Oct. 27, 2017 regarding International Application No. PCT/US2017/044926 (16 pages).

*Primary Examiner* — Faisal M Zaman
(74) *Attorney, Agent, or Firm* — Harness, Dickey & Pierce, P.L.C.

(57) ABSTRACT

The present disclosure relates to a distributed console server system. The system may have a server and a software module loaded onto the server for communications with a plurality of remote devices within a data center. A remote serial port unit may be included which is in communication with the server and which is controlled in part by the server and the software module. The remote serial port unit may be in communication with the plurality of remote devices. The remote serial port unit may include at least one of a first module including a plurality of RJ45 ports, or a second module including a plurality of USB ports.

20 Claims, 4 Drawing Sheets

(56) References Cited

U.S. PATENT DOCUMENTS

| | | | |
|---|---|---|---|
| 7,361,053 B1* | 4/2008 | Boone | G02B 6/3897 439/541.5 |
| 2003/0142683 A1* | 7/2003 | Lam | H04L 12/2898 370/401 |
| 2004/0117536 A1 | 6/2004 | Franke et al. | |
| 2004/0184249 A1* | 9/2004 | Aguinaga, Jr. | H01R 12/52 361/788 |
| 2005/0198245 A1* | 9/2005 | Burgess | G06F 3/14 709/223 |
| 2007/0097659 A1 | 5/2007 | Behrens et al. | |
| 2008/0037214 A1* | 2/2008 | Niazi | G06F 1/20 361/679.3 |
| 2008/0040527 A1* | 2/2008 | Filipov | G06F 1/1632 710/303 |
| 2008/0244052 A1* | 10/2008 | Bradicich | G06F 1/183 709/223 |
| 2008/0250486 A1* | 10/2008 | Gibson | G06F 21/34 726/9 |
| 2009/0031051 A1* | 1/2009 | Nguyen | G06F 3/0605 710/15 |
| 2010/0100767 A1* | 4/2010 | Liu | H04L 41/0806 714/28 |
| 2010/0277866 A1* | 11/2010 | Chen | G06F 21/74 361/679.57 |
| 2011/0026525 A1* | 2/2011 | He | H04L 49/351 370/392 |
| 2011/0243064 A1* | 10/2011 | McManus | H04W 4/20 370/328 |
| 2012/0207141 A1* | 8/2012 | Norair | H01Q 1/084 370/338 |
| 2013/0215884 A1* | 8/2013 | Lo | G06F 3/023 370/359 |
| 2013/0227136 A1* | 8/2013 | Sturgeon | G06F 1/206 709/224 |
| 2013/0232352 A1* | 9/2013 | Kent | G06F 1/263 713/310 |
| 2014/0118920 A1* | 5/2014 | Ng | G06F 1/20 361/679.33 |
| 2014/0213078 A1* | 7/2014 | Huang | H01R 12/721 439/76.1 |
| 2015/0242357 A1* | 8/2015 | Pancholi | G06F 13/102 710/13 |
| 2016/0041609 A1* | 2/2016 | Apro | H04Q 1/09 361/679.4 |
| 2016/0170931 A1* | 6/2016 | Quach | G06F 13/4282 710/313 |
| 2016/0203455 A1* | 7/2016 | Hicks | G07G 1/0081 705/75 |
| 2018/0116071 A1* | 4/2018 | Stevens | H05K 7/1498 |

* cited by examiner

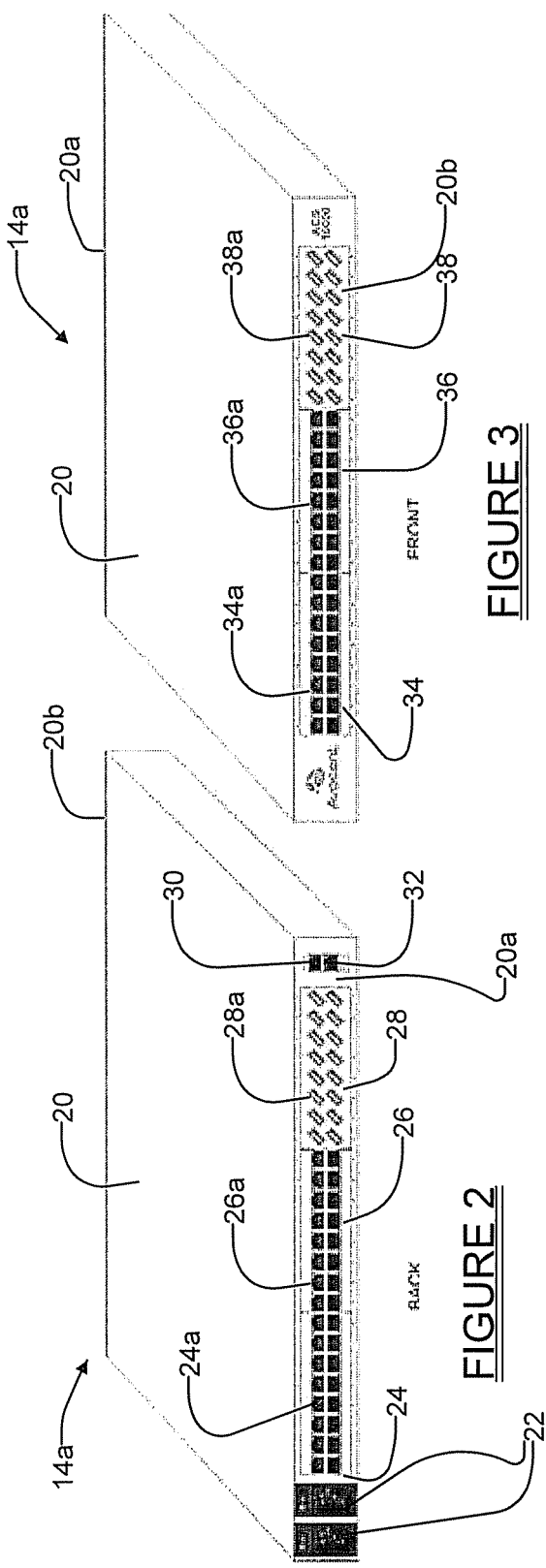
FIGURE 2
FIGURE 3
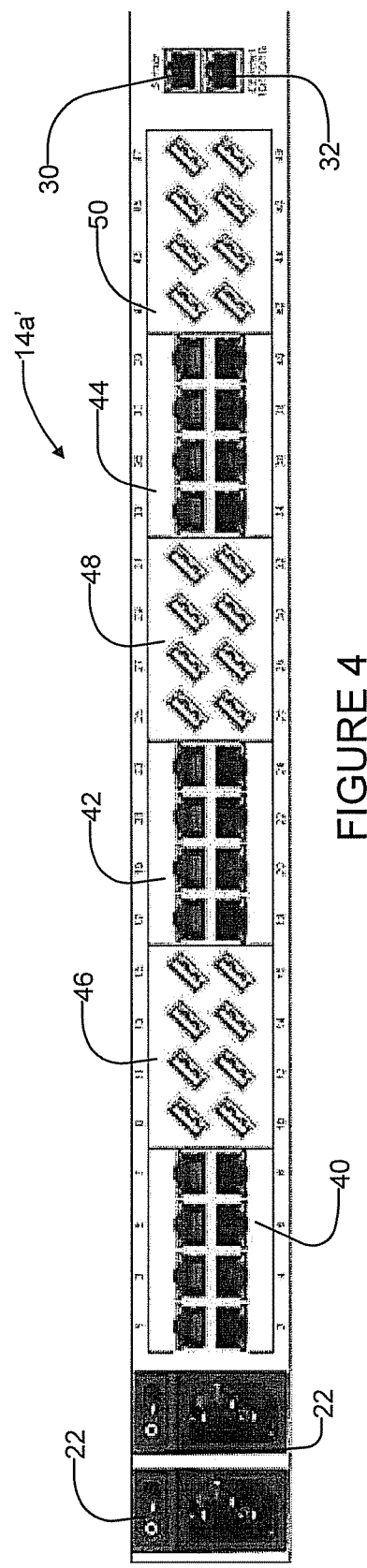
FIGURE 4

SYSTEM AND METHOD FOR DISTRIBUTED CONSOLE SERVER ARCHITECTURE

CROSS-REFERENCE TO RELATED APPLICATIONS

This application claims the benefit of U.S. Provisional Application No. 62/370,006, filed on Aug. 2, 2016. The entire disclosure of the above application is incorporated herein by reference.

FIELD

The present disclosure relates to systems and methods for interfacing with the serial consoles of various data center infrastructure devices and information technology devices, and more particularly to a system and method that uses custom configurable remote serial port units and related software that runs on a management server, for communicating with the remote serial port units.

BACKGROUND

The statements in this section merely provide background information related to the present disclosure and may not constitute prior art.

Serial port devices are widely used in modern day data centers. At the present time there is a need for a scalable serial port solution along with a unified approach to serial console management. A component that enables a unified approach to serial console management would have particular appeal for administrators of medium size, large and very large datacenters, where dozens, hundreds or even thousands of serial port devices may be in use. Such very large scale data centers are presently operated by corporations such as Google Inc., Apple Inc., Facebook Inc., and the LinkedIn Corporation.

It would also be desirable to decrease (or at least maintain) the current cost per serial port for the hardware being used, while offering advanced software features that can be easily implemented in a unified, scalable serial port solution. A new serial port architecture and solution would provide data center management professionals a greater degree of integration with their own software tools and easy management of the new serial port solution and connected target devices.

Still further, it would be desirable to provide serial port hardware devices that can be easily and quickly reconfigured with different combinations of RJ-45 ports and USB ports to enable the data center professional to adapt the devices to the changing needs of a modern day data center.

SUMMARY

In one aspect the present disclosure relates to a distributed console server system. The system may comprise a server and a software module loaded onto the server for communications with a plurality of remote devices within a data center. A remote serial port unit may be included which is in communication with the server and which is controlled in part by the server and the software module. The remote serial port unit may be in communication with the plurality of remote devices. The remote serial port unit may include at least one of a first module including a plurality of RJ45 ports, or a second module including a plurality of USB ports.

In another aspect the present disclosure relates to a distributed console server system comprising a server and a software module. The software module may be loaded onto the server for communications with a plurality of remote devices within a data center. A remote serial port unit may be included which is in communication with the server. The remote serial port unit may be controlled in part by the server and the software module. The remote serial port unit may have a front panel and a rear panel, and may be in communication with the plurality of remote devices. The remote serial port unit may further include a first RJ45 module including a plurality of RJ45 ports accessible from the front panel, a first USB module including a plurality of USB ports accessible from the front panel, and at least one of a second RJ45 module or a second USB module accessible from the rear panel.

In another aspect the present disclosure relates to a method for forming a distributed console server for use in a data center. The method may comprise providing a server, and a software module loaded on the server for communications with a plurality of remote devices within the data center. The method may further involve using a remote serial port unit to communicate with the server, and where the remote serial port unit is controlled in part by the server and the software module. The method may further include using the remote serial port unit to communicate with the plurality of remote devices, and using at least one of a first module including a plurality of RJ45 ports or a second module including a plurality of USB ports, configured within the remote serial port unit, to communicate with the plurality of remote devices.

BRIEF DESCRIPTION OF THE DRAWINGS

The drawings described herein are for illustration purposes only and are not intended to limit the scope of the present disclosure in any way.

FIG. 2 is a view of a rear panel of the 96 port RSPU in FIG. 1, in this example showing the RSPU configured to have 32 RJ-45 serial ports and 16 USB serial ports accessible from its rear panel;

FIG. 3 is a front view of the RSPU of FIG. 2 showing 32 additional RJ-45 serial ports and 16 additional USB serial ports accessible from its front panel, for a total capacity of 64 RJ-45 ports and 32 USB ports;

FIG. 4 is a view of the rear panel of a differently configured RSPU which includes a total of 24 RJ-45 serial ports formed from three independent RJ-45 serial port modules, and 24 USB serial ports formed from three independent USB serial port modules;

DETAILED DESCRIPTION

Figure 1:
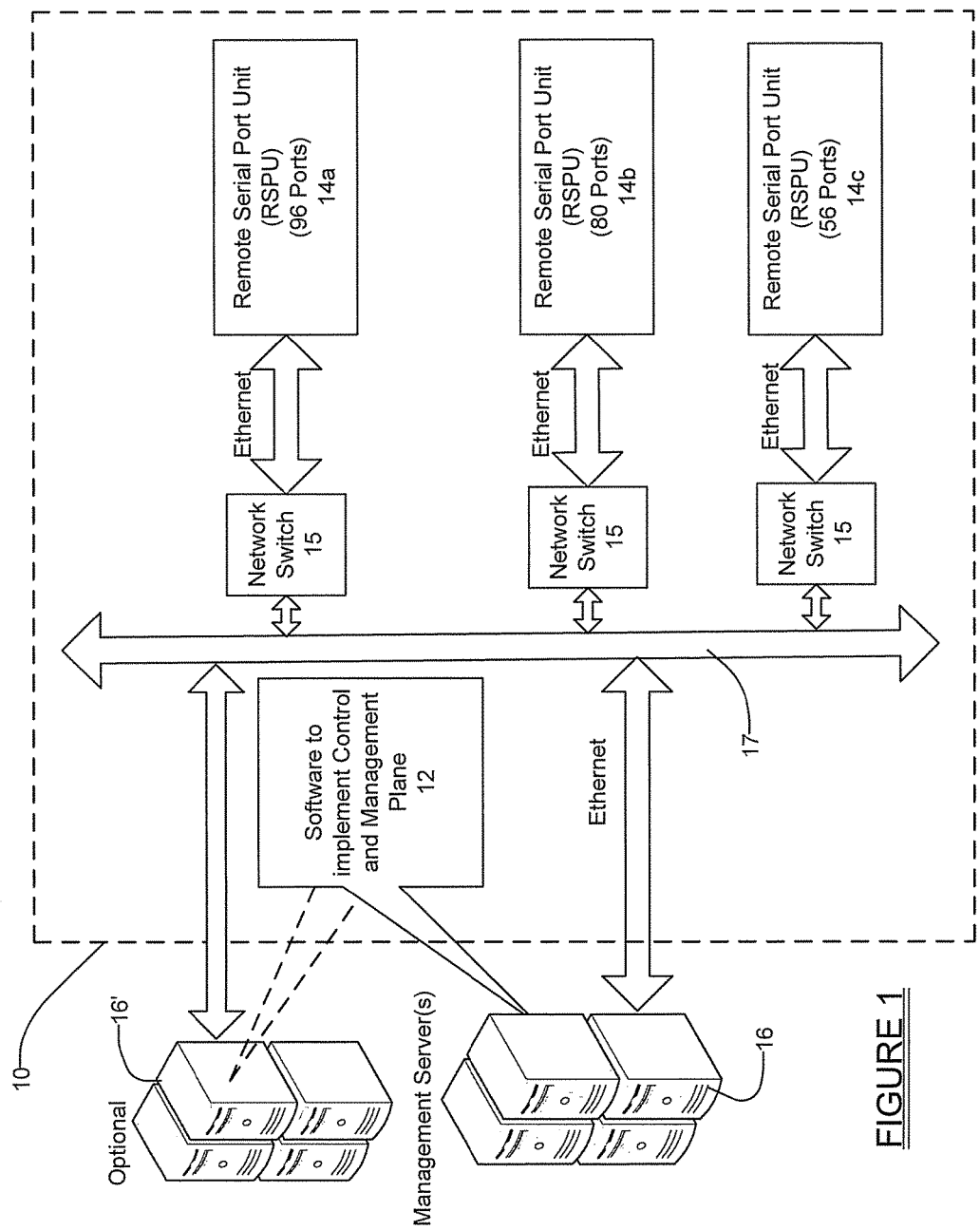
FIG. 1 is a high level block diagram of a system in accordance with one embodiment of the present disclosure, wherein the system makes use of three remote serial port units (RSPUs) having different port capacities.

The following description is merely exemplary in nature and is not intended to limit the present disclosure, application, or uses. It should be understood that throughout the drawings, corresponding reference numerals indicate like or corresponding parts and features.

Referring to FIG. 1 there is shown one embodiment of a console server system 10 in accordance with the present disclosure. The system 10 in this example makes use of a software module 12 to implement a control and management plane (hereinafter simply "software 12") on a management server 16, and one or more hardware devices in the form of remote serial port units 14a, 14b and 14c. While three remote serial port units ("RSPUs") 14a-14c have been shown, it will be appreciated that a greater or lesser plurality of RSPUs 14 could be used to form the system, and the system 10 is therefore not limited to use with any specific number of RSPUs 14.

The management server 16 uses the software 12 to communicate with and control each of the RSPUs 14a-14c via a network 17 and the well-known Ethernet protocol. The network 17 may be either a production network or a management network, but in most instances the RSPUs 14 will be coupled to network switches 15 and will be communicating with the serial console ports of various infrastructure devices (e.g., power distribution units (PDUs)), Computer Room Air Conditioners (CRACs), uninterruptible power supplies (UPSs), as well as various information technology (IT) devices (e.g., servers, storage devices, network switches, routers, etc.), and therefore the network 17 will in most applications be a management network. However, the system 10 is not limited to any specific type of communications network, or any specific network communications protocol. It will also be understood that the network switches 15 and the network 17 are not part of the system 10. An optional configuration may have a copy of the software 12 installed on an additional server 16' to provide for failover protection.

A significant advantage of the system 10 is that the system is easily scalable to meet the changing needs of the modern day data center. Removing the required software for communicating and controlling each RSPU 14a-14c from the RSPUs, and using the software 12 instead on a conventional management server 16, has a number of important advantages. The fact that the software 12 is operated on the management server 16 (i.e., a standard server) not only contributes to ease in scalability of the system 10, but also allows the software 12 to run on virtualized servers, thus offering greater flexibility to the data center administrator. Running the software 12 on the management server 16, especially in a virtualized environment, also enables strategies for load balancing and server failover, with multiple servers running the software 12 in parallel. Furthermore, since the code for the software 12 is compiled and run on a standard server, no cross compiler and tool chain is needed. Still further, running the software 12 on a standard server will enable libraries to be used for serial port integration on user applications (i.e., actually not only serial port, but any managed target device). These libraries could be "Glib-style" for C applications, a set of C++ or Python objects, or even a Java package if needed, or any popular Web technology for Web-based applications. And since the system 10 has the software 12 "decoupled" from the RSPUs 14a-14c (i.e., from the firmware associated with each RSPU 14), this helps to ensure that the great majority of new software releases and/or updates can be simply software-based. It is expected that only in rare instances would the RSPUs 14 require a true firmware update.

Still another advantage of separating the software 12 and running the software on the management server 16 is the ability to leverage the increased computing power and memory capacity that typically exists on a conventional server. Running the software 12 on the management server 16 means that a much more powerful CPU, with considerably greater memory, is now available to run user applications in connection with the software 12.

Referring further to FIG. 1, RSPU 14a in this example has 96 serial ports total available for use, while RSPU 14b has been configured with 80 serial ports total, and RSPU 14c has been configured with 56 ports total. As will be explained in the following paragraphs, another significant advantage is that the RSPUs 14a-14c are readily scalable and re-configurable by the use of hot swappable serial port modules. This makes the RSPUs 14 readily adaptable to the changing needs in a data center. However, it will be appreciated that the RSPUs 14a-14c do not need to be configured as hot swappable modules, although it is anticipated that having hot swappable capability is likely to be considered an especially convenient feature for many users.

Referring to FIGS. 2 and 3, one configuration of RSPU 14a is shown. The RSPU 14a has a housing 20 with a rear panel 20a shown in FIG. 2, and a front panel 20b shown in FIG. 3. In FIG. 2 the rear panel 20a includes two independent, hot-swappable power supply modules 22, a first hot-swappable RJ-45 serial port module 24 having 16 RJ-45 ports 24a, a second hot-swappable RJ-45 serial port module 26 having 16 RJ-45 ports 26a, and a hot-swappable USB serial port module 28 having 16 USB serial ports 28a. A sensor port 30 may be included for connecting an external sensor (e.g., temperature, humidity, air flow, etc.), and an Ethernet port 32 for coupling the RSPU 14a directly to the management server 16, to a network router or to one of the network switches 15. The front panel 20b of RSPU 14a in this example includes a third hot-swappable, RJ-45 serial port module 34 with 16 RJ-45 ports 34a, a fourth hot-swappable RJ-45 serial port module 36 with 16 RJ-45 ports 36a, and a second hot-swappable USB serial port module 38 with 16 USB ports 38a. Thus, RSPU 14a in this example has a total of 64 RJ-45 serial ports available for use and a total of 32 USB serial ports available for use. The form factor of the housing 20 in this example is a "1-U" form factor enabling the RSPU 14a to be supported in 1 RU of a standard computer equipment rack. However, it will be appreciated that the RSPUs 14 may be configured with other form factors, and thus the RSPUs are not limited to any specific form factor.

It will also be appreciated that the RJ-45 serial port modules 24, 26, 34 and 36 are all identical in construction, while the USB serial port modules 28 and 38 are identical in construction. This enables easy hot swapping of all of the RJ-45 serial port modules 24, 26, 34 and 36, as well as the USB serial port modules 28 and 38. This also produces a fully modular construction for the RSPU 14a, with different combinations of RJ-45 and USB serial port modules being selectable by the user to meet the expanding/changing needs of a data center.

Referring to FIG. 4, RSPU 14 is shown with a slightly different serial port module configuration and has been denoted with reference number 14a'. Power supply modules 22 in this example are both included, as are sensor port 30 and Ethernet port 32, but instead of using 16 port serial port modules, six independent 8 port serial port modules are used. Thus, 8 port RJ-45 serial port modules 40, 42 and 44 are used, while 8 port USB serial port modules 46, 48 and 50 are used.

Figure 5:
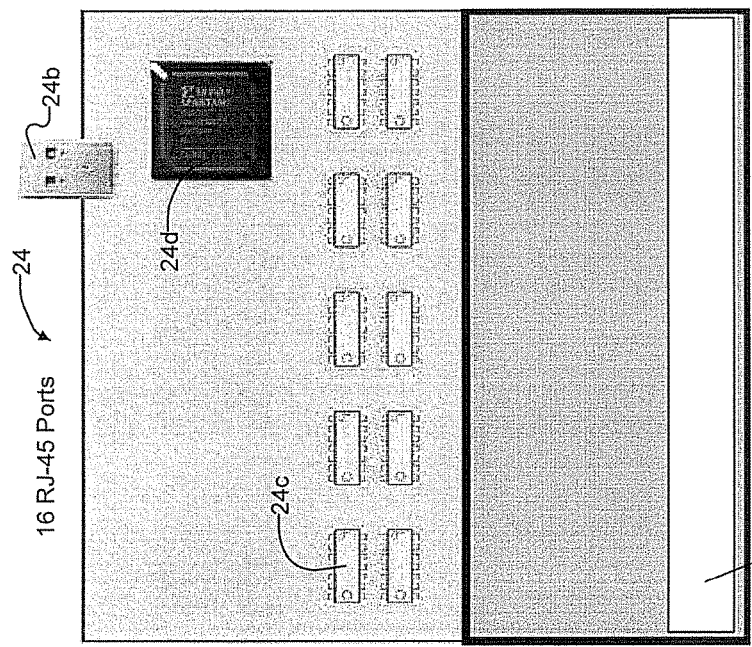
FIG. 5 is a simplified plan view of one 16 port RJ-45 serial port module showing a USB male connector to enable hot swappable coupling with a backplane (not shown) of the RSPU.

FIG. 5 shows a more detailed illustration of one of the 16 port RJ-45 serial port modules 24 from FIG. 2. In this example the 16 port RJ-45 serial port module 24 includes the 16 RJ-45 ports 24a (shown in simple diagrammatic form in this Figure), in addition to a USB connector 24b. A plurality of integrated circuits 24c are used along with a processor 24d. The processor 24d communicates with the integrated circuits 24c and also with the USB connector 24b to help implement selection of, and communication with, specific ones of the RJ-45 ports 24a. Processor 24d can be an IC device such as an FPGA with embedded CPU core and miscellaneous logic in order to simplify the hardware and minimize materials cost. Integrated circuits 24 may be composed of memory IC's, serial transceivers and miscellaneous logic. The USB connector 24b enables the entire 16 port RJ-45 serial port module 24 to be plugged into a backplane or motherboard, and provides data and control signals, as well as DC power, to the module 24a. The USB connector 24b enables the module 24a to be hot swappable, and thus quickly and easily installed and removed from a backplane or motherboard, and reinserted at a different location on the backplane or motherboard, or even used in a different RSPU 14. However, it will be appreciated that the use of a USB backplane is not absolutely necessary; any backplane technology could be incorporated in place of the USB connection, such as a PCIE, standard data bus, etc. In fact, a backplane is not even necessary. The RSPUs 14 could just as easily be configured with "fixed" RJ-45 serial port modules mounted on a printed circuit assembly (PCA) mounted within the housing 20. Again, however, it is expected that the modular approach using hot swappable RJ-45 modules is likely to be the most desirable configuration for most users.

Figure 6:
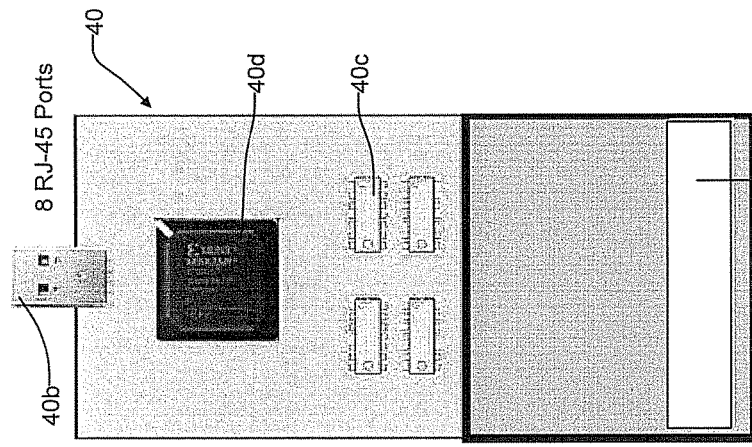
FIG. 6 is a simplified plan view of one 8 port RJ-45 serial port module.

FIG. 6 shows a high level plan view of the 8 port RJ-45 serial port module 40 from FIG. 4. The module 40 is similar to module 24 in that it includes 8 RJ-45 ports 40a, a USB connector 40b, a plurality of integrated circuits 40c and a processor 40d. The functions of the USB connector 40b, the integrated circuits 40c and the processor 40d are identical to that described for module 24.

Figure 7:
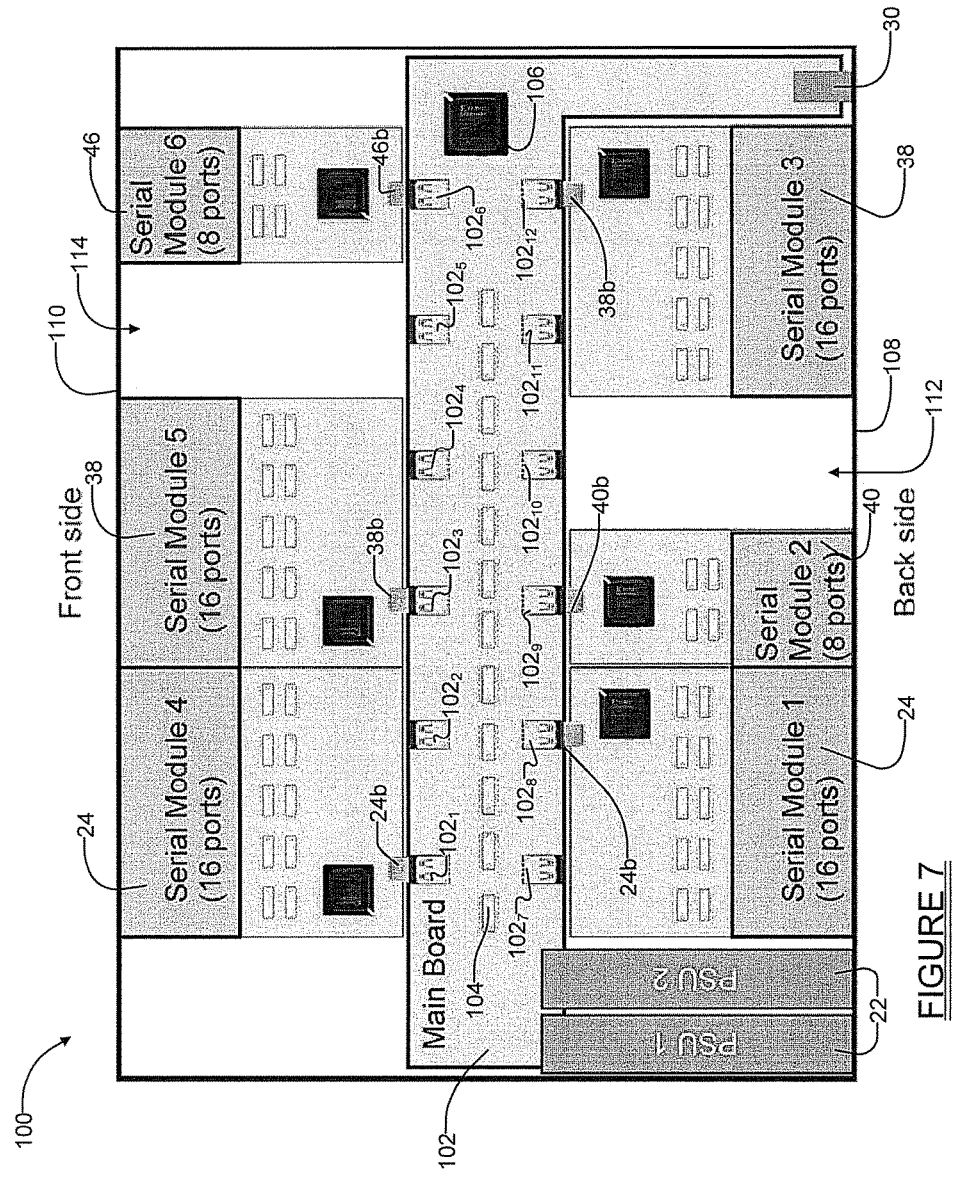
FIG. 7 shows a plan view of an interior area of one RSPU showing one example of a configuration of six independent serial port modules coupled to a main board of the RSPU via USB connectors.

FIG. 7 shows a high level plan view of an RSPU 100 showing one example of how a main board 102 (e.g., backplane or motherboard) may be used to accommodate both 8 and 16 port serial port modules, whether they be RJ-45 port versions or USB port versions. The main board 102 in this example includes a plurality of 12 USB connectors $102_1$-$102_{12}$, along with a plurality of integrated circuits 104 and a processor 106. Two independent power supplies 22 are also included, and the RJ-45 sensor port 30 is also visible in this plan view.

The RSPU 100 in the example configuration shown in FIG. 7 includes one of the 16 port RJ-45 serial port modules 24, one of the 16 port USB serial port modules 38, and one of the 8 port RJ-45 serial port modules 40, all connected via their USB connectors 24b, 38b and 40b, respectively, to USB connectors $102_8$, $102_{12}$ and $102_9$, respectively, of the main board 102. Modules 24, 38 and 40 are accessible from a back panel 108 of the RSPU 100. From a front panel 110 of the RSPU 100, one 16 port RJ-45 port serial module 24, one 16 port USB serial port module 38 and one 8 port USB serial port module 46 are accessible and coupled via their respective USB connectors 24b, 38b and 46b with USB connectors $102_1$, $102_3$ and $102_8$, respectively, on the main board 102. The RSPU 100 thus forms an 80 port unit. This configuration leaves room for one additional 8 port serial port module (either RJ-45 or USB, such as module 40 or 46) at location 112, accessible via the back panel 108 and connectable via the USB connector $102_{10}$. It also leaves room for one additional 8 port serial module (either RJ-45 or USB, such as module 40 or 46), accessible from the front panel 110, at location 114. If an even greater number of USB connectors are provided on the main board 102, then it would be possible to make use of 4 port modules as well with the RSPU 100. In this example, there is physical space to and one more USB connector on the main board 102 to make use of a 4 port serial module (either RJ-45 or USB). From FIG. 7, it will be appreciated that the RSPU 100 may be configured in wide variety of different configurations to best utilize the available serial port modules 24,38, 40 and 46 and to best meet the needs of connecting to the serial console ports of the target devices.

Figure 8:
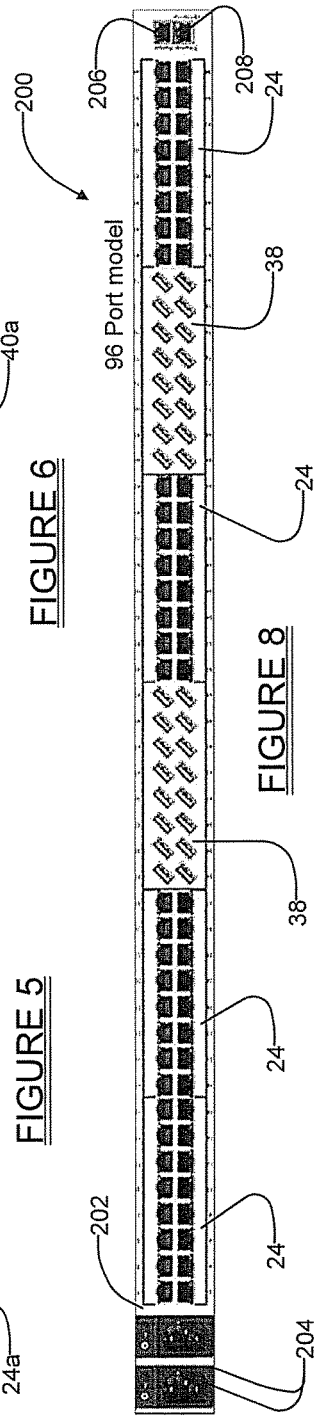
FIG. 8 shows another embodiment of an RSPU of the present disclosure in which the RSPU has a zero-U form factor, but still includes 96 total serial ports, with 64 of the available ports being RJ-45 ports and 32 being USB ports.

Referring to FIG. 8, another embodiment of an RSPU 200 is shown in accordance with the present disclosure. The RSPU 200 in this example has a housing 202 providing a zero-U form factor, while still providing 96 total serial ports. In this example the RSPU 200 includes four 16 port RJ-45 serial port modules 24 and two 16 port USB serial port modules 38. Two independent power supplies 204 are included which may be functionally identical to power supplies 22, but modified to accommodate the zero-U form factor of the housing 202. A sensor port 206 and an Ethernet in/out port 208 are also included in this example.

Still another advantage of the system 10 and the use of the RSPUs 14 is the benefit of serial port consolidation. Once consolidated, the serial ports can be split into groups of arbitrary sizes to easily accommodate the needs of cloud services hosts that rent their infrastructure by eliminating physical boundaries and facilitating dynamic access control lists. This feature may be of particular interest to very large scale datacenter operators. It also helps to eliminate the problem of trying to manage access control lists on individual remote access appliances, which is generally not a viable solution for dynamic environments where who has access to which serial port may constantly vary.

Since the software 12 of the system 10 runs on a regular server, implementing service processor management using the system 10, via a remote access appliance, is not only possible but highly desirable. This opens the possibility of using the system 10 to help implement serial, power and cooling system management for data center IT devices and infrastructure devices. Thus, the system 10 may help a data center manager to implement a broad range of infrastructure management services for those IT and infrastructure devices having a serial console port.

Another advantage of the system 10 is that the various RSPU modules 14 all make use of the well-known USB communications protocol. USB is a proven and stable technology and is in presently in use with most IT and infrastructure devices. USB connectors and the USB protocol are also are ideally suited for implementing hot-swappable modules.

Still another advantage is that with the software 12, as more RSPUs 14 are added, the newly available ports of each RSPU may automatically be presented on a graphical user interface provided by the software 12. There is no need for a new version of the software 12 or for console server reconfiguration and/or configuration alignment.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A distributed console server system, comprising:
a server;
a software module loaded onto the server for communications with a plurality of remote devices within a data center;
a remote, configurable serial port unit in communication with the server and being controlled in part by the server and the software module, the remote configurable serial port unit being in communication with the plurality of remote devices; and
wherein the remote configurable serial port unit includes a chassis having a form enabling mounting of the chassis in a mounting location inside of an equipment rack, independently of the server, a main board having a plurality of first USB connectors spaced laterally along a width of the chassis, and facing at least one of a front side or a rear side of the chassis, and wherein the chassis is configured to slidably receive and removably house at least one of:
a first slidably insertable and removable module including a plurality of RJ45 ports and one second USB connector, the one second USB connector being connectable to a first one of the plurality of first USB connectors upon sliding insertion into the chassis; or
a second slidably insertable and removable module including a plurality of USB ports and another second USB connector, the another second USB connector being connectable to a second one of the first USB connectors upon sliding insertion into the chassis; and
wherein the first slidably insertable and removable module is able to be coupled selectively to at least two different ones of the plurality of first USB connectors, to thus enable placement in at least two different locations within the chassis;
wherein the second slidably insertable and removable module is able to be coupled selectively to at least two different ones of the plurality of first USB connectors, to enable selective placement of the slidably insertable and removable module in at least two different locations within the chassis; and
wherein the first and second slidably insertable and removable modules are each removable and re-insertable into different ones of the plurality of first USB connectors without removing the chassis from the equipment rack.

2. The system of claim 1, wherein the first slidably insertable and removable module is a hot swappable module.

3. The system of claim 1, wherein the second slidably insertable and removable module is a hot swappable module.

4. The system of claim 1, wherein the remote, configurable serial port unit includes both the first slidably insertable and removable module and the second slidably insertable and removable module.

5. The system of claim 4, wherein both of the first and second slidably insertable and removable modules are hot swappable.

6. The system of claim 1, wherein the remote, configurable serial port unit further comprises a sensor port.

7. The system of claim 1, further comprising a port for connecting to a network.

8. The system of claim 1, wherein the first slidably insertable and removable module includes one of:
a 16 port RJ-45 port hot swappable module; or
an 8 port RJ-45 port hot swappable module.

9. The system of claim 1, wherein the second slidably insertable and removable module includes one of:
a 16 port USB hot swappable module; or
an 8 port USB hot swappable module.

10. The system of claim 1, wherein the chassis has a front panel and a rear panel.

11. The system of claim 10, wherein the chassis includes the first slidably insertable and removable module positioned for access from the front panel and the second slidably insertable and removable module positioned for access from the front panel.

12. The system of claim 10, wherein the chassis includes the first slidably insertable and removable module and the second slidably insertable and removable module both positioned for access from the rear panel.

13. The system of claim 10, wherein:
the first and second slidably insertable and removable modules are both included and accessible from the front panel; and
an additional RJ45 module is included and accessible from the rear panel; and
an additional USB module is included and accessible from the rear panel.

14. The system of claim 13, wherein all of the first and second slidably insertable and removable modules, and the additional RJ45 and USB modules, are hot swappable modules.

15. A distributed console server system, comprising:
a server;
a software module loaded onto the server for communications with a plurality of remote devices within a data center;
a remote serial port unit in communication with the server and being controlled in part by the server and the software module, the remote serial port unit having:
a chassis including a front panel and a rear panel and being in communication with the plurality of remote devices, the chassis enabling the remote serial port unit to be supported within a mounting location of an equipment rack, independent of the server; and
a main board disposed within the chassis;
the main board including a plurality of first USB connectors spaced apart laterally along a width of the chassis, wherein a first subplurality of the plurality of first USB connectors face toward the rear panel and a second subplurality of the plurality of first USB connectors face toward the front panel;
wherein the remote serial port unit includes:
a slidably insertable and removable first RJ45 module including a plurality of RJ45 ports accessible from the front panel, and a second USB connector connectable with any one of the plurality of first USB connectors on the main board;
a slidably insertable and removable first USB module including a plurality of USB ports accessible from the front panel, and another second USB connector connectable with any one of the plurality of first USB connectors; and at least one of a slidably insertable and removable second RJ45 module or a second USB module having an additional USB connector and connectable with the main board from the rear panel; and wherein the slidably insertable and removable first RJ45 module and first USB module are removable and re-insertable into the chassis without removing the chassis from the equipment rack.

16. The system of claim 15, wherein:

the slidably insertable and removable first RJ45 module and the slidably insertable and removable first USB module are hot swappable modules; and wherein the at least one of a slidably insertable and removable second RJ45 module or a second USB module is a hot swappable module.

17. The system of claim 15, further including both of the slidably insertable and removable second RJ45 module and the slidably insertable and removable second USB module.

18. A method for forming a distributed console server for use in a data center, the method comprising:

providing a server;

locating a software module loaded on the server for communications with a plurality of remote devices within the data center;

locating a user configurable remote serial port unit having a chassis within a mounting location of an equipment rack, such that the chassis supports the user configurable remote serial port unit in the mounting location of the equipment rack independently from the server;

using the user configurable remote serial port unit to communicate with the server and to be at least partially controlled by the server and the software module;

using the remote serial port unit to communicate with the plurality of remote devices;

using at least one of a first module including a plurality of RJ45 ports or a second module including a plurality of USB ports, configured to engage with one of a plurality of laterally spaced apart USB connectors on a main board disposed within a chassis of the remote serial port unit, to communicate with the plurality of remote devices; and wherein each of the first and second modules are slidably insertable into the chassis, and slidably removable from the chassis, to change a configuration of the remote serial port unit, without the need to remove the chassis from the equipment rack.

19. The method of claim 18, wherein the using at least one of a first module or a second module includes using at least one of a slidably insertable hot swappable first module or a slidably insertable hot swappable second module.

20. The method of claim 18, further comprising using both of the first and second slidably insertable modules, and further configuring the first and second slidably insertable modules as hot swappable modules.

* * * * *